(12) United States Patent
Liu et al.

(10) Patent No.: US 11,483,938 B2
(45) Date of Patent: Oct. 25, 2022

(54) METHOD FOR CONNECTING STACKED CIRCUIT BOARDS

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Rui-Wu Liu, Shenzhen (CN); Ming-Jaan Ho, New Taipei (TW); Man-Zhi Peng, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 749 days.

(21) Appl. No.: 16/221,433

(22) Filed: Dec. 14, 2018

(65) Prior Publication Data
US 2020/0107455 A1    Apr. 2, 2020

(30) Foreign Application Priority Data
Sep. 29, 2018  (CN) .......................... 201811151504.8

(51) Int. Cl.
*H05K 3/36*    (2006.01)
*H05K 3/40*    (2006.01)
(Continued)

(52) U.S. Cl.
CPC .............. *H05K 3/361* (2013.01); *H05K 1/144* (2013.01); *H05K 1/148* (2013.01); *H05K 3/067* (2013.01);
(Continued)

(58) Field of Classification Search
CPC .......... H05K 3/067; H05K 3/36; H05K 3/361; H05K 3/368; H05K 2203/1554;
(Continued)

(56) References Cited

U.S. PATENT DOCUMENTS

| 4,602,316 | A  |   | 7/1986 | Feick |
| 6,448,506 | B1 | * | 9/2002 | Glenn .................... H05K 1/144 |
|           |    |   |        | 174/260 |

(Continued)

FOREIGN PATENT DOCUMENTS

| CN | 101416567 A | 4/2009 |
| CN | 102238806 A | 11/2011 |

(Continued)

OTHER PUBLICATIONS

P. Clot, J.; Zeberli, J.; Chenuz, F. Ferrando; and D. Styblo, "Flip-chip on flex for 3D packaging," Twenty Fourth IEEE/CPMT International Electronics Manufacturing Technology Symposium (Cat. No. 99CH36330), 1999, pp. 36-41, doi: 10.1109/IEMT.1999. 804793. (Year: 1999).*

(Continued)

*Primary Examiner* — A. Dexter Tugbang
(74) *Attorney, Agent, or Firm* — ScienBiziP, P.C.

(57) ABSTRACT

A method for connecting stacked circuit boards includes: a connecting structure is provided, the connecting structure is a bendable and flexible circuit board; a first circuit board and a plurality of supporting posts are provided, each of the supporting posts is dispersedly fixed to a side surface of the first circuit board; a second circuit board is provided, and two peripheral portions of the connecting structure are respectively fixed to the first circuit board and the second circuit board, the peripheral portions of the connecting structure are respectively near two opposite ends of the connecting structure; the connecting structure is bent to flip (Continued)

the second circuit board super-positioned above the first circuit board, and the second circuit board is connected to a free end of each of the supporting posts.

11 Claims, 6 Drawing Sheets

(51) Int. Cl.
*H05K 1/14* (2006.01)
*H05K 3/06* (2006.01)
*H01R 43/20* (2006.01)

(52) U.S. Cl.
CPC ........... *H05K 3/368* (2013.01); *H05K 3/4007* (2013.01); *H01R 43/205* (2013.01); *H05K 3/36* (2013.01); *H05K 2203/1554* (2013.01); *H05K 2203/1563* (2013.01)

(58) Field of Classification Search
CPC ........... H05K 2203/1563; H05K 1/144; H05K 1/148; H05K 3/4007; H01R 43/205
See application file for complete search history.

(56) References Cited

U.S. PATENT DOCUMENTS

| | | | | |
|---|---|---|---|---|
| 2009/0039053 | A1* | 2/2009 | Yeh | H05K 3/067 216/13 |
| 2011/0269319 | A1* | 11/2011 | Cheng | H05K 1/144 439/67 |

FOREIGN PATENT DOCUMENTS

| | | |
|---|---|---|
| CN | 102438393 A | 5/2012 |
| JP | 2011014809 A * | 1/2011 |

OTHER PUBLICATIONS

Machine Language Translation of CN 102438393, Sep. 2022. (Year: 2022).*

* cited by examiner

METHOD FOR CONNECTING STACKED CIRCUIT BOARDS

FIELD

The subject matter herein generally relates to method for connecting stacked circuit boards.

BACKGROUND

In order to increase the surface-mounting area of the circuit boards to have sufficient number of the passive components, one circuit board is super-positioned on another circuit board via a sandwiched connecting structure.

Traditionally, the connecting structure is a hollowed plate having through holes which are drilled at the portion near the edge of the connecting structure, and the circuit boards are electrically connected through the coating or metallization of the hole walls. However, such a connecting method requires complicated processes and process equipment, and the cost may be high as a result.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 1:
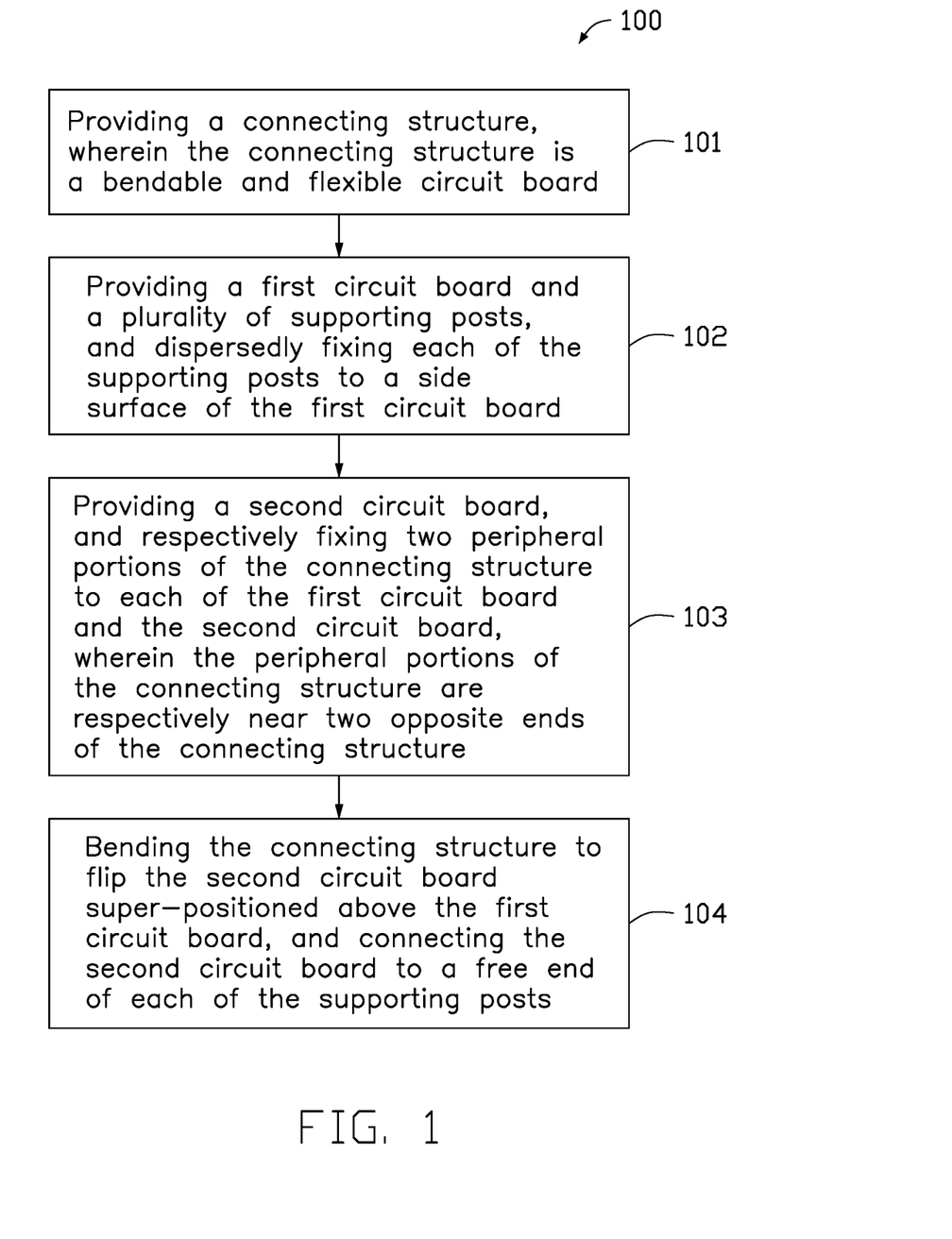
FIG. 1 is a flowchart of a method for connecting stacked circuit boards according to an embodiment.

FIG. 1 shows a flowchart for a method for connecting stacked circuit boards 100 in accordance with an embodiment. The method is provided by way of embodiment, as there are a variety of ways to carry out the method 100. The method 100 described below can be carried out using the configurations shown in FIGS. 2a-8, for example, and various elements of these figures are referenced in explaining the method 100. Each block shown in FIG. 1 represents one or more processes, methods, or subroutines, carried out in the method. Furthermore, the shown order of blocks is illustrative only and the order of the blocks can change. Additional blocks can be added or fewer blocks may be utilized, without departing from this disclosure. The example method can begin at block S101.

Figure 2A:
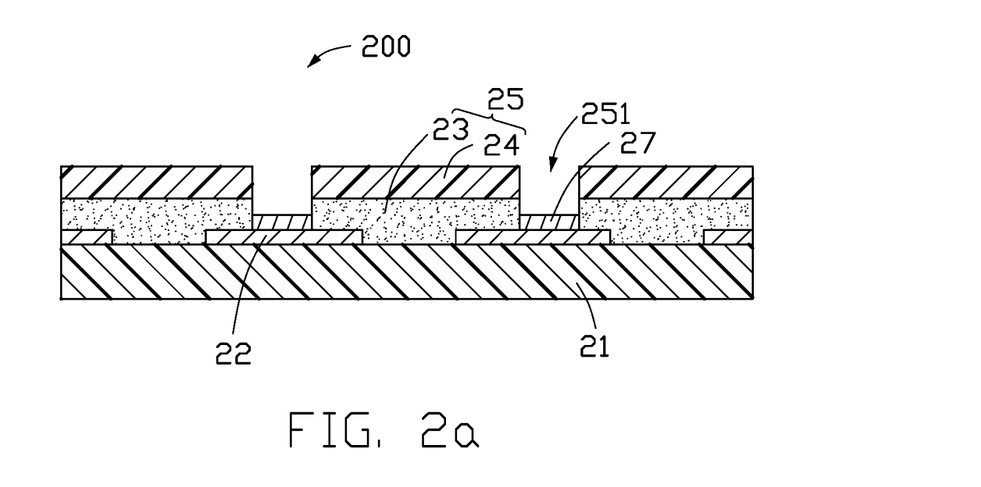
FIG. 2a shows a cross sectional view of a connecting structure in the method for connecting stacked circuit boards of FIG. 1.
Figure 2B:
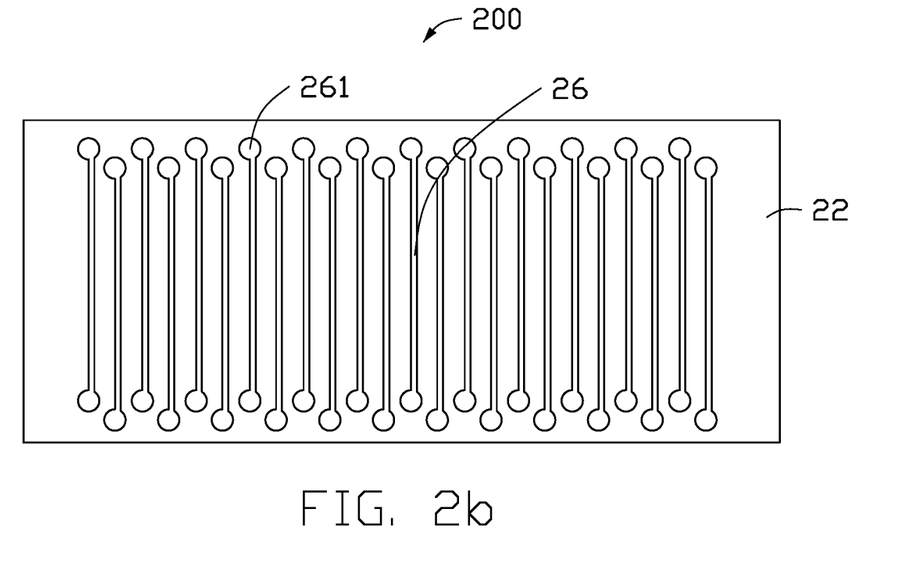
FIG. 2b shows a plan view of the connecting structure in FIG. 2a with hiding its cover layer and treatment layer.

At block S101, referring to FIGS. 2a and 2b, a connecting structure 200 is provided, the connecting structure 200 is a bendable and flexible circuit board.

The connecting structure 200 includes a base 21, a copper layer 22, and a cover layer 25. The cover layer 25 includes an adhesive layer 23 and a film 24. One side of the copper layer 22 is attached on the film 24 by the adhesive layer 23, the other side of the copper layer 22 is pressed on the base 21.

The base 21 and the film 24 are made of, but not limited to, polyimide (PI), liquid crystal polymer (LCP), polyethylene terephthalate (PET), or Polyethylene Naphthalate (PEN).

The adhesive layer 23 is insulated and is a viscous resin. The adhesive layer 23 may be at least one of Polypropylene, epoxy, polyurethane, phenolic, urea-formaldehyde, melamine-ormaldehyde and polyimide.

A thickness of the copper layer 22 is selected according to the copper thickness specification of the line process. Typically, the thickness of the copper layer 22 is less than or equal to 3 μm.

The copper layer 22 is line patterned and surface treated. Specifically, a side of the copper layer 22 facing away from the base 21 is processed to form a wiring layer 26. The film 24 is attached on the copper layer 22 for covering the wiring layer 26.

A plurality of openings 251 are defined on the cover layer 25 for exposing contacting pads 261 of the wiring layer 26 respectively. The openings 251 are defined by a die punching, cutting, laser, or the like.

The contacting pads 261 are respectively near two opposite ends of the wiring layer 26. In an embodiment, each of the contacting pads 261 is circle. The contacting pads 261 are surface treated, and a treatment layer 27 is formed therewith for protecting the contacting pads 261. The treatment layer 27 electronically connects the wiring layer 26.

Figure 3:
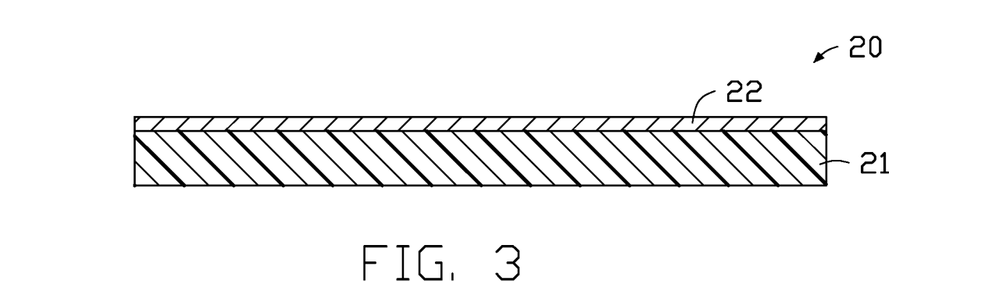
FIG. 3 to FIG. 5 show embodiments of the connecting structure in FIG. 2a and FIG. 2b at each stage of manufacturing processes according to the method in FIG. 1.
Figure 4:
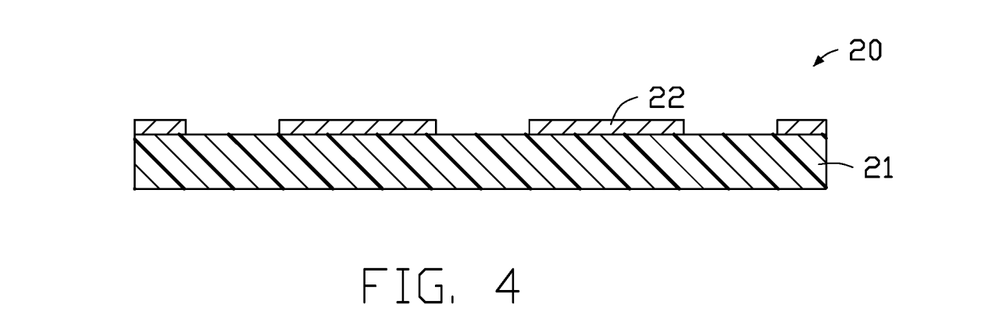
Figure 5:
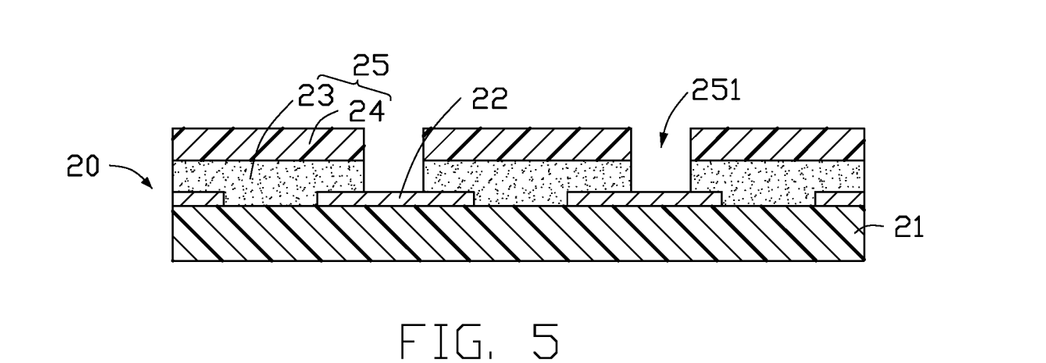

FIGS. 3 to 5 show of embodiments of the structure 200 at each stage of manufacturing processes according to the method in FIG. 1. The manufacturing processes of the connecting structure 200 includes: providing copper clad substrate 20 as illustrated in FIG. 3. The copper clad substrate 20 includes the base 21 and the copper layer 22. In FIG. 4, a side of the copper layer 22 facing away from the base 21 is patterned for forming the wiring layer 26. FIG. 2a is an embodiment of the wiring layer 26. In FIG. 5, the cover layer 25 is attached on the wiring layer 26 such that the cover layer 25 covers the copper layer 22 and exposes the contacting pads 261 of the wiring layer 26. The contacting pads 261 are surface treated.

FIG. 3 shows a cross sectional view of the copper clad substrate 20. The copper clad substrate 20 is a signal-side copper clad substrate.

FIG. 4 shows a cross sectional view of the copper clad substrate 20 after line patterned. The wiring layer 26 is formed by laser according to the embodiment as disclosed.

FIG. 5 shows a cross sectional view of the copper clad substrate 20 in FIG. 4 with the cover layer 25 attached. The cover layer 25 includes the adhesive layer 23 and the film 24. The film 24 is pressed on the copper layer 22 by the adhesive layer 23 for covering the wiring layer 26. The openings 251 exposes the contacting pads 261 of the wiring layer 26 as shown in FIG. 5 and FIG. 2a.

The surface treatment of the contacting pads 261 of the wiring layer 26 may be performed by electroless nickel immersion gold (ENIG), organic solderability preservatives (OSP), electroless nickel electroless palladium immersion gold (ENEPIG), and the like.

Figure 6:
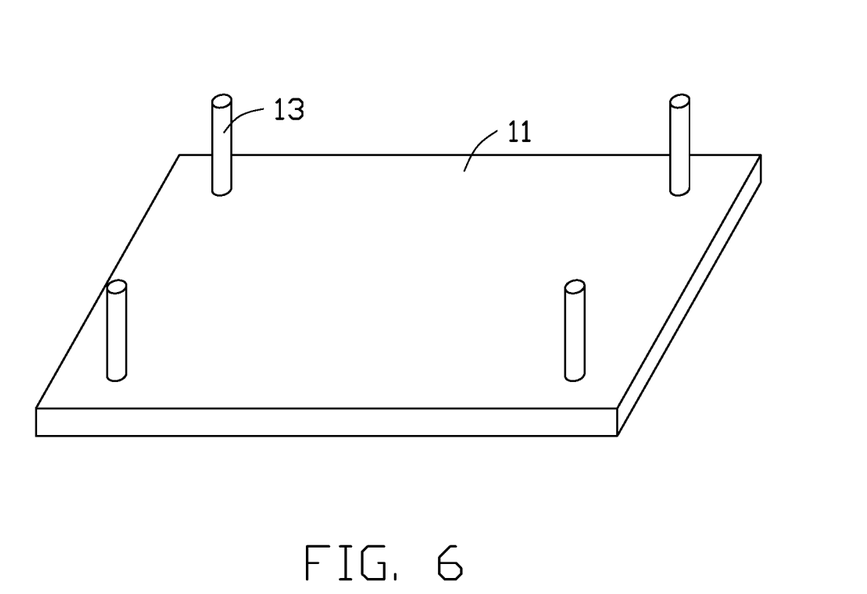
FIG. 6 to FIG. 8 show processes of the connecting structure in FIG. 2a and FIG. 2b to circuit boards.

At block S102, referring to FIG. 6, a first circuit board 11 and a plurality of supporting posts 13 are provided, and the supporting posts 13 are dispersedly fixed to a side surface of the first circuit board 11.

A height of the supporting post 13 is larger than or equal to a height of passive components mounted on the circuit boards. A detail structure of the supporting post 13 will be described as below.

Figure 7:
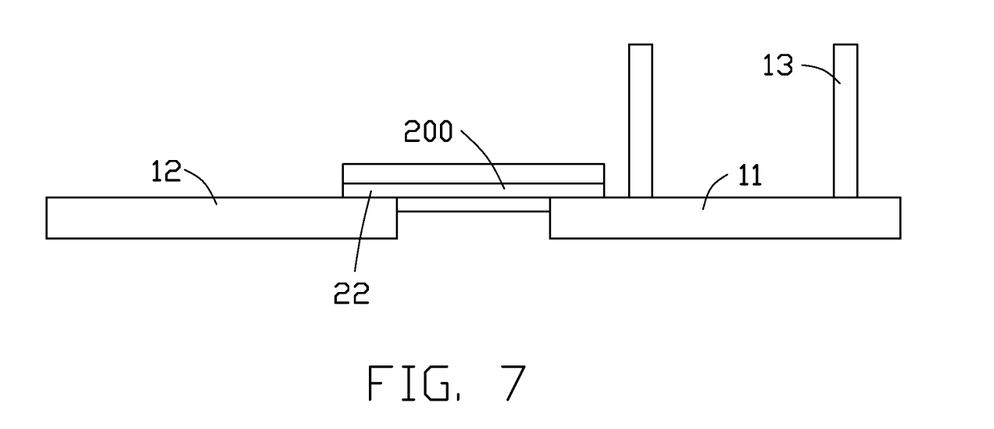

At block S103, as shown in FIG. 7, a second circuit board 12 is provided, two peripheral portions of the connecting structure 20 are respectively fixed to the first circuit board 11 and the second circuit board 12. The two peripheral portions are in two opposite ends of the connecting structure.

Specifically, the contacting pads 261 of the wiring layer 26 are respectively fixed to the first circuit board 11 and the second circuit board 12, and thus the treatment layer 27 and the wiring layer 26 electronically connect the first circuit board 11 and the second circuit board 12. The copper layer 22 can be fixed to the first circuit board 11 and the second circuit board 12 by solder paste or conductive particles.

Figure 8:
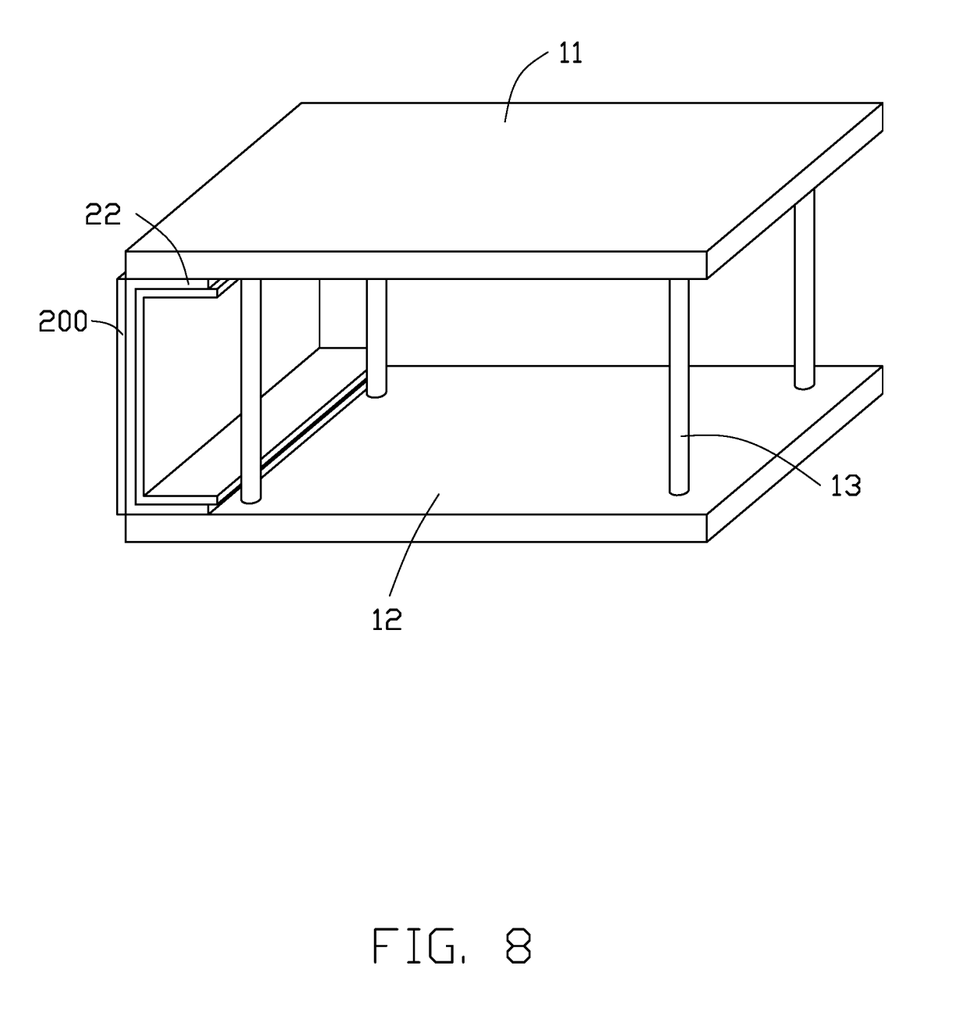

At block S104, referring to FIG. 8, the connecting structure 200 is bent to flip the second circuit board 12 super-positioned above the first circuit board 11, and the second circuit board 12 is connected to a free end of each of the supporting posts 13.

The embodiment as disclosed in FIG. 8, the connecting structure 200 is bent to a U-shape.

Figure 9A:
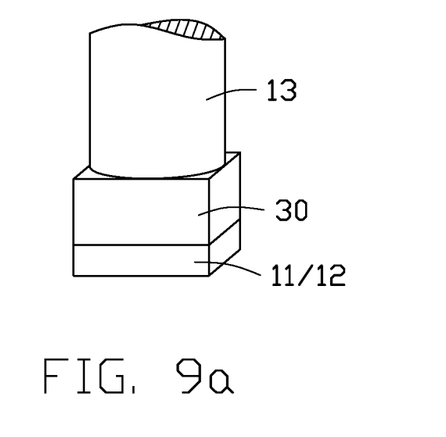
FIG. 9a and FIG. 9b are schematic views of embodiments showing a supporting post connecting to a circuit board.
Figure 9B:
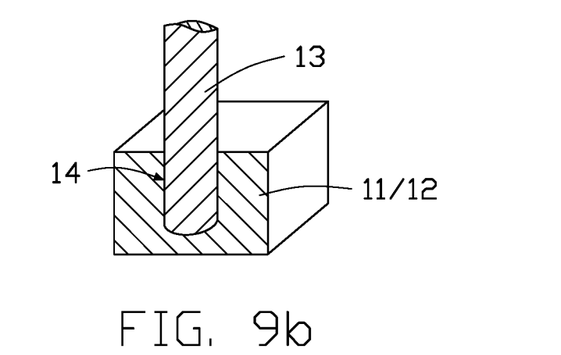

The connection between the supporting posts 13 and the first circuit board 11 and/or the second circuit board 12 can be achieved by (1) SMT hitting mode, that is, surface mounting, as shown in FIG. 9a wherein the supporting posts 13 are fixed to the first circuit board 11 and/or the second circuit board 12 by using solder pastes 30; or (2) referring to FIG. 9b by drilling, wherein each of the supporting posts 13 is positioned and fixed in one of the holes 14 drilled on the first circuit board 11 and/or the second circuit board 12.

Figure 9C:
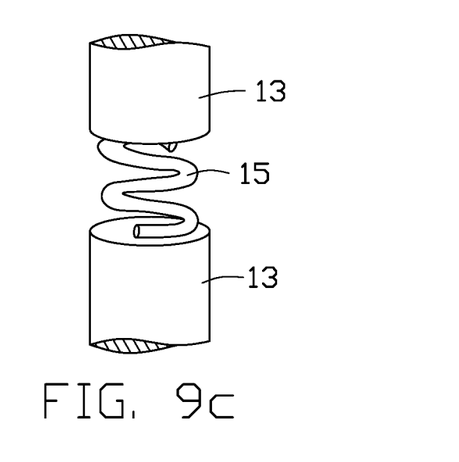
FIG. 9c is a schematic structural view of the supporting post in another embodiment.

The supporting posts 13 may be a metal column, such as a copper column or an iron column; or a non-metallic column made of a polymer material, such as polypropylene (PP) or plasticized polyvinyl chloride (PVC). The supporting post 13 may be an integral cylinder, as shown in FIG. 8, or a two-stage cylinder connected by a spring 15, as shown in FIG. 9c.

The method for connecting stacked circuit boards 100 of the present disclosure uses a flexible circuit board as the connection structure 200, with a simple processing technology of the flexible circuit board (FPC), thus simplifies the flow and process of the method, thereby reducing the cost.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for connecting stacked circuit boards, comprising:
   providing a connecting structure, wherein the connecting structure is a bendable and flexible circuit board;
   providing a first circuit board and a plurality of supporting posts, and dispersedly fixing each of the supporting posts to a side surface of the first circuit board;
   providing a second circuit board, and respectively fixing two peripheral portions of the connecting structure to the side surface of the first circuit board and a surface of the second circuit board, wherein the peripheral portions of the connecting structure are respectively near two opposite ends of the connecting structure;
   bending the connecting structure to flip the second circuit board super-positioned above the first circuit board, wherein the first circuit board and the second circuit board extend from the bent connecting structure toward a side of the bent connecting structure, the supporting posts is located between the first circuit board and the second circuit board; and
   connecting the second circuit board to a free end of each of the supporting posts, wherein two opposite ends of each of the supporting posts are respectively in contact with the side surface of the first circuit board connecting the connecting structure and the surface of the second circuit board connecting the connecting structure.

2. The method for connecting stacked circuit boards of claim 1, wherein the connecting structure comprises a base, a copper layer, and a cover layer, the copper layer is pressed on the base, the cover layer covers the copper layer, a plurality of openings are defined on the cover layer for exposing contacting pads of the copper layer, the contacting pads are on opposite edges of the copper layer and respectively forms the two peripheral portions of the connecting structure which are respectively fixed to the first circuit board and the second circuit board.

3. The method for connecting stacked circuit boards of claim 2, wherein the cover layer comprises an adhesive layer and a film, the film is attached on the copper layer by the adhesive layer and faces away from the base.

4. The method for connecting stacked circuit boards of claim 2, further comprising:
   forming a wiring layer on a side of the copper layer opposite away from the base such that the contacting pads are formed from the wiring layer;
   covering the wiring layer with the cover layer, the contacting pads being exposed from the plurality of openings on the cover layer;
   surface treating the contacting pads of the wiring layer to form a treatment layer; and
   electrically connecting the treatment layer and the wiring layer to each of the first circuit board and the second circuit board.

5. The method for connecting stacked circuit boards of claim 2, wherein the contacting pads are fixed to the first circuit board and the second circuit board by solder paste or conductive particles.

6. The method for connecting stacked circuit boards of claim 1, wherein a providing method of the connecting structure comprising:
   providing a copper clad substrate comprising a base and a copper layer;
   patterning a side of the copper layer opposite away from the base to form a wiring layer;
   attaching a cover layer on the wiring layer, wherein the cover layer covers the copper layer and exposes the contacting pads of the wiring layer from the plurality of openings;
   surface treating the contacting pads of the wiring layer.

7. The method for connecting stacked circuit boards of claim 6, wherein the surface treatment of the contacting pads of the wiring layer is performed by electroless nickel immersion gold, organic solderability preservatives, or electroless nickel electroless palladium immersion gold.

8. The method for connecting stacked circuit boards of claim 1, wherein the supporting posts are fixed to each of the first circuit board and the second circuit board with solder pastes.

9. The method for connecting stacked circuit boards of claim 1, wherein the supporting posts are positioned and fixed in holes drilled on each of the first circuit board and the second circuit board.

10. The method for connecting stacked circuit boards of claim 1, wherein the supporting post is an integral cylinder.

11. The method for connecting stacked circuit boards of claim 1, wherein the supporting post is a two-stage cylinder connected by a spring.

* * * * *